United States Patent [19]

Sahara et al.

[11] 3,968,452
[45] July 6, 1976

[54] SIGNAL LEVEL CONTROL CIRCUIT

[75] Inventors: Hiroshi Sahara, Tokyo; Yutaka Tanaka, Kawasaki, both of Japan

[73] Assignee: Sony Corporation, Tokyo, Japan

[22] Filed: Nov. 6, 1974

[21] Appl. No.: 521,394

[30] Foreign Application Priority Data

Nov. 13, 1973 Japan.............................. 48-127460
Dec. 14, 1973 Japan.............................. 48-140525
Dec. 15, 1973 Japan.............................. 48-140842

[52] U.S. Cl................................ 330/29; 307/264; 330/35; 357/23
[51] Int. Cl.²....................................... H03G 3/30
[58] Field of Search.................. 307/264, 296, 304; 330/29, 35; 357/23

[56] References Cited
UNITED STATES PATENTS 3,714,522  1/1973  Komiya et al....................... 357/23
3,832,645  8/1974  Greutman........................... 330/29

*Primary Examiner*—Paul L. Gensler
*Attorney, Agent, or Firm*—Hill, Gross, Simpson, Van Santen, Steadman, Chiara & Simpson

[57] ABSTRACT

A signal level control circuit having an amplifying transistor in combination with a resistive layer insulator semiconductor field effect transistor in which the drain and source electrodes of the field effect transistor are connected in series with the base and emitter electrodes of the amplifying transistor. A main input signal is applied to the base electrode of the amplifying transistor, a control voltage of either D.C. or lower frequency than said main signal is applied to the first and second gate electrodes of the field transistor and a level controlled output signal is obtained from the collector electrode of the amplifying transistor whereby the output signal level is made to be a linear function of the control voltage applied to the gate electrodes of the field effect transistor.

8 Claims, 13 Drawing Figures

SIGNAL LEVEL CONTROL CIRCUIT

BACKGROUND OF THE INVENTION

1. Field of the Invention

This invention relates generally to a signal level control circuit and more particularly to such a circuit in which a resistive layer insulator semiconductor field effect transistor is employed as a variable impedance element.

2. Description of the Prior Art

A resistive layer insulator semiconductor field effect transistor, as the name implies, is a field effect transistor having a resistive layer overlying an insulating layer on a semiconductor substrate. This field effect transistor has an extremely low distortion characteristic as compared with conventional field effect transistors, CdS photo-conductive impedance elements, etc. when used as an impedance element.

Therefore, it has been proposed to use the resistive layer insulator semiconductor field effect transistor as a variable impedance element in a signal attenuation circuit as disclosed in a co-pending application Ser. No. 358,168, filed May 7, 1973. However, in such an attenuator circuit, the gain of the circuit does not become a linear function of the variable D.C. control voltage applied to the gate electrodes of the resistive layer insulator semiconductor field effect transistor.

Further, in such an attenuator circuit, the response speed of the circuit to the control voltage cannot be designed fast by reason of a condenser circuit connected to the resistive layer insulator semiconductor field effect transistor.

SUMMARY OF THE INVENTION

Accordingly, it is an object of this invention to provide an improved and specific signal level control circuit employing the aforesaid field effect transistor as a variable impedance element.

It is another object of this invention to provide an improved signal level control circuit employing the aforesaid field effect transistor in which the gain of the circuit is determined with a linear function of the control voltage applied to the gate electrodes of the field effect transistor.

It is a further object of this invention to provide an improved signal level control circuit employing the aforesaid field effect transistor in which the response speed of the circuit to the control voltage applied to the gate electrodes of the field effect transistor is improved and made to be extremely fast.

According to one embodiment of this invention, the signal level control circuit includes an amplifying transistor having base, emitter and collector electrodes and a resistive layer insulator semiconductor field effect transistor having source, drain, first gate and second gate electrodes. The drain and source electrodes of the field effect transistor are connected in series with the base and emitter electrodes of the amplifying transistor. A main input signal is applied to the base electrode of the amplifying transistor, voltage signal of either D.C. or lower frequency than that of the main input signal is applied to the first and second gate electrodes of the aforesaid field effect transistor, and a level controlled output signal is obtained from the collector electrode of the amplifying transistor.

In such a construction, an output signal of extremely low distortion is obtained and further the level of the output signal is varied as a linear function of the control voltage which is applied to the gate electrodes of the resistive layer insulator semiconductor field effect transistor.

According to another embodiment of the invention, the response speed of the level control operation of the circuit is much improved and becomes very fast by applying the control voltage signal to both sides of a condenser which is connected between the drain and second gate electrodes of the field effect transistor.

According to a further embodiment of the invention, the main input signals are applied to the circuit intermittently and the response speed of the level control operation of the circuit is much improved and becomes very fast by connecting a switching element between the first and second gate electrodes of the field effect transistor in which the switching element is made conductive intermittently only between the input signals.

The features of the invention are set forth with particularity in the appended claims. The invention itself, however, both as to its organization and method of operation, together with further objects and advantages thereof, may be understood by reference to the following description taken in connection with the accompanying drawings.

DETAILED DESCRIPTION OF PREFERRED EMBODIMENTS

Figure 1:
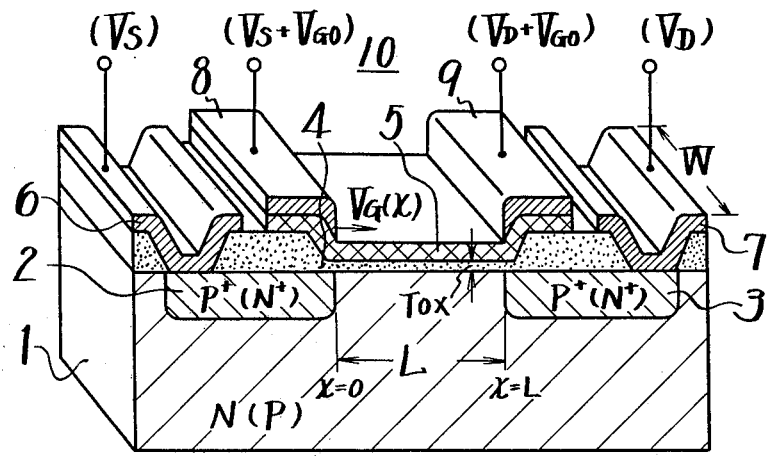
FIG. 1 is a diagrammatic sectional isometric view of a resistive layer insulator semiconductor field effect transistor suitable for use in circuits embodying the invention.

In FIG. 1, a reference numeral 10 shows a resistive layer insulator semiconductor field effect transistor as a whole, in which reference numeral 1 designates a semiconductor substrate of N-type. From the upper surface, a $P^+$-type source region 2 and $P^+$-type drain region 3 are respectively formed but spaced by a distance L from each other. On the surface of the substrate 1 at least between source 2 and drain 3, an insulating layer 4 such as a $SiO_2$ film is formed and further on the insulating layer 4 a resistive layer 5 is formed. By way of example, this layer 5 may be polycrystalline silicon material whose surface resistivity is 10 kilo-ohms per square to 30 giga-ohms per square. A metallic electrode 6 for source 2 and a metallic electrode 7 for drain 3 are respectively attached to both the regions and a first gate electrode 8 close to the source electrode 6 and a second gate electrode 9 close to the drain electrode 7 are also attached on the resistive layer 5. The drain facing edge of electrode 8 must be exactly coincident with the drain facing edge of source 2, similarly, the source facing edge of electrode 9 must be exactly coincident with the source facing edge of drain 3. Any variation from this precise arrangement causes distortion.

The substrate 1, by way of example, is of a relatively low impurity density. Particularly, in a case where an integrated circuit in which a further substrate is normally provided under the substrate 1 with a different conductive type therefrom is provided, the density of the substrate 1 is such as to provide a resistivity of about 50 ohm-cm or more to avoid or reduce the effect of the IC substrate and further the densities of the regions 2 and 3 are respectively about $10^{20}$ atoms/cm$^3$. The length L of the channel is about $20\mu$ (micron), its width is about $300\mu$ and the thickness of the insulating layer 4, Tox, in case of $SiO_2$, is about 1200 A-(angstrom). The layer 5 of polycrystalline silicon is about $1\mu$ in thickness. The surface resistivity thereof is in the range of 10 kilo-ohm/square - 30 giga-ohm/square. Since the resistivity of the layer 5 is very high, special contacts must be used for the electrodes 8 and 9. In such construction, a potential V(X) at point X in the channel area spaced some distance from the source region 2, a gate voltage $V_G(X)$ in the gate at the corresponding point thereto and a threshold voltage Vth of this device are respectively defined as:

$$V_G(X) - V(X) > Vth$$

Where variation of Vth due to the voltage of the substrate 1 is very small or negligible. Then, the number N of charge carriers at the point X per unit area will be given as follows:

$$N = \frac{C_o}{q}\{V_G(X) - V(X) - Vth\}/cm^2$$

where
$C_o = \epsilon_{ox}/T_{ox}$
$\epsilon O_x$ : dielectric constant of the insulating layer 4
$q$ : electron charges of the carrier On the other hand, resistance R(X) in the channel between the end of the region 2 and the point X will be $$dR(X) = \rho_s(X)\frac{dX}{W}$$

$$\rho_s(X) = \frac{1}{Nq\mu}$$

where $\rho_s(X)$ is the surface resistivity of the channel, and $\mu$ is the mobility of the charge carriers. As a result, $$dR(X) = \frac{1}{C_o\mu\{V_G(X) - V(X) - Vth\}} \cdot \frac{dX}{W}$$

Accordingly, the channel current I will be $$I\,dR(X) = dV(X)$$

-continued
$$= \frac{I}{W\mu C_o\{V_G(X) - V(X) - Vth\}}dX \quad (1)$$

If
$$V_G(X) - V(X) = V_{Go} = \text{constant} \quad 2.$$

is supposed, and the equation (1) is integrated from $X = 0$ to $X = L$ (channel length);

$$\int_O^V \{V_G(X) - V(X) - Vth\}dV(X) = \frac{L}{W\mu C_o}I$$

the following equation will be obtained:

$$I = \beta(V_{Go} - Vth)V \quad (3)$$

where
$V = V(L)$, $$\beta = \frac{W\mu C_o}{L}$$

Finally, it should be noted that the equation (3) is a linear function with the condition (2). In case the potentials of source 2 and drain 3 are $V_S$ and $V_D$ respectively, the first gate electrode 8 should be $V_S + V_{Go}$ and the second gate electrode 9 should be $V_D + V_{Go}$ and the equation (3) can be satisfied.

This means that a first linear equation ($I = RV$) in the channel between source 2 and drain 3 can be obtained and the channel resistance R(X) will be on a linear line. The resistance or impedance can be controlled only by the gate voltage $V_{Go}$.

Figure 2:
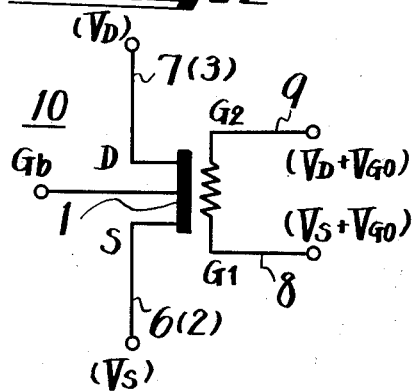
FIG. 2 is a symbol representation of a resistive layer insulator semiconductor field effect transistor.
Figure 4:
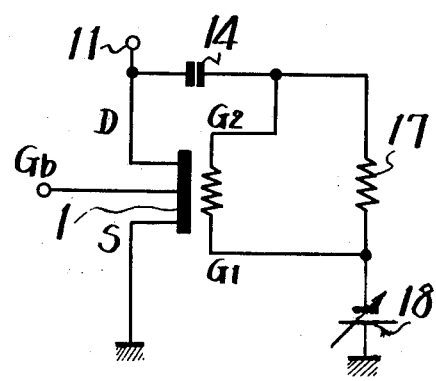
Figure 5:
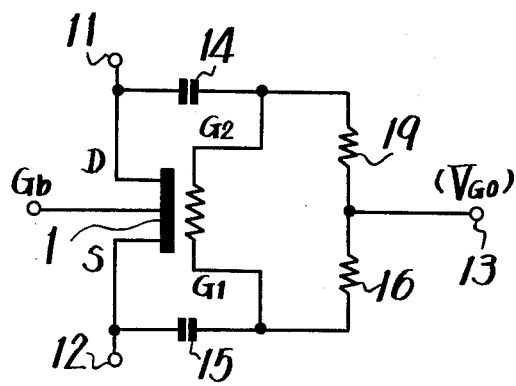

FIG. 2 is a symbolic representation of the resistive layer insulator semiconductor field effect transistor, in which there are shown the source electrode S, the drain electrode D, the first gate electrode $G_1$, the second gate electrode $G_2$, and the substrate or back gate electrode $G_b$. With this device 10, a variable impedance circuit can be easily constructed as shown in FIGS. 3 to 5 which will be explained in detail hereinafter.

Figure 3:
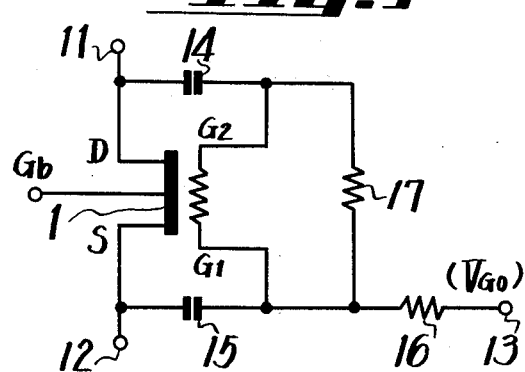
FIGS. 3 to 5 are circuit diagrams showing variable impedance circuits formed by resistive layer insulator semiconductor field effect transistors respectively suitable for use in circuits embodying the invention.

FIG. 3 shows one example where the drain electrode is connected to a terminal 11 which is also connected to the second gate electrode $G_2$ through a condenser 14. The source electrode is connected to a terminal 12 which is also connected to the first gate electrode $G_1$ through a condenser 15, and a gate protecting resistor 17 is connected between the first and second gate electrodes. A control terminal 13 is connected to the first gate electrode through a resistor 16 to which a control signal is applied. In such a case, if desired, a backgate voltage (biasing in reverse) will be applied to the substrate 1 through the back gate $G_b$. In case of P-channel enhancement type, a positive backgate voltage will be applied and a control voltage $V_{Go}$ will be negative.

In the circuit of FIG. 3, if the resistance between the first and second gate electrodes, in other words, the resistance of the resistive layer 5 is neglected because it is high enough as compared with that of the resistor 17 of several mega-ohms, frequency $f_1$ of an input signal, frequency $f_2$ of the control signal $V_{Go}$, capacity $C_{14}$ of the condenser 14, capacity $C_{15}$ of the condenser 15, resistance $R_{16}$ of the resistor 16 and resistance $R_{17}$ of the resistor 17 are respectively selected to satisfy the following inequalities:

$$f_1 \gg f_2 \qquad (4\text{-}1)$$

where $f_2$ is usually D.C. or low frequency, $$R_{16} \text{ and } R_{17} \gg \frac{1}{2\pi f_1 C_{15}} \qquad (4\text{-}2)$$

$$R_{17} \gg \frac{1}{2\pi f_1 C_{14}} \qquad (4\text{-}3)$$

At the same time, the reactances of the condensers 14 and 15 are selected to be small from the standpoint of $f_1$ of the input signal, while selected to be large from the standpoint of $f_2$ of the control signal $V_{GO}$, so that the potentials of the first and second gate electrodes become respectively $V_S + V_{GO}$ and $V_D + V_{GO}$. Therefore, in accordance with the equation (3), a linear impedance characteristic between the terminals 11 and 12 is obtained, which can be adjusted by the control signal $V_{GO}$ applied at the terminal 13. The circuit arrangement shown in FIG. 3 is very simple and thus will be suited for an AGC circuit because the necessary condition $f_1 \gg f_2$ can be satisfied therein.

FIG. 4 shows a source grounded circuit where the condenser 15 in FIG. 3 will be eliminated therefrom because $V_S = 0$. In FIG. 4, reference numeral 18 indicates a control voltage source of $V_{GO}$ and the other elements corresponding to those of FIG. 3 are marked with the same references. With these circuits of FIGS. 3 and 4, in case of the control voltage $V_{GO}$ being changed, the charging and dischaging operations of the condensers 14 and 15 are carried out through the resistor 17, so that the condition $f_1 \gg f_2$ will be necessary.

To this end, in a circuit of FIG. 5 a resistor 19 is connected between the second gate electrode $G_2$ and the control voltage terminal 13. In this case, if its resistance value is taken as $R_{19}$, the same is chosen so as to satisfy a condition $C_{14} \cdot R_{19} = C_{15} \cdot R_{16}$.

With the above arrangement, since the impedance of an external circuit connected to the terminals 11 and 12 is normally quite small as compared with those of the resistors 16 and 19, a balanced bridge circuit is formed by the resistors 16 and 19 and condensers 14 and 15. Thus, the potential difference between the gate electrodes $G_1$ and $G_2$ will become nearly zero and the same control voltage $V_{GO}$ is equally applied to both the terminals $G_1$ and $G_2$ from the terminal 13. According to this example, a condition $f_1 > 5f_2$ will be usable instead of $f_1 \gg f_2$.

There are variously proposed signal level control circuits which are very low in distortion with the variable impedance circuits shown in FIGS. 3 to 5 being used. A circuit shown in FIG. 6 is a typical example for the above circuits.

Figure 6:
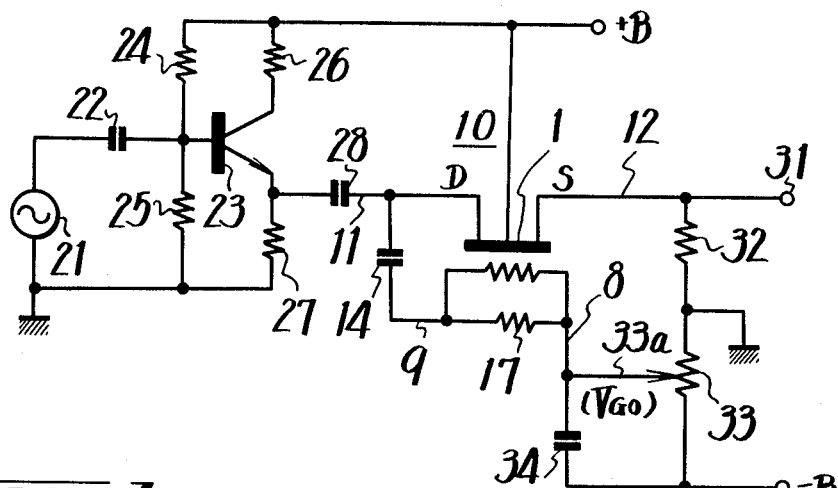
FIG. 6 is a schematic diagram of a signal level control circuit to be used for explaining this invention.

In FIG. 6, reference numeral 21 represents an input signal source, one end of which is grounded and the other end of which is connected through a condenser 22 to the base electrode of an npn-type transistor 23. The base electrode of the transistor 23 is connected through a resistor 24 to a positive voltage source terminal +B, to which a positive DC voltage, for example, a voltage of 18 volts is supplied, and also through a resistor 25 to the ground. The collector electrode of the transistor 23 is connected through a resistor 26 to the positive voltage source terminal +B, while the emitter electrode thereof is grounded through a resistor 27 and also connected through a condenser 28 to a drain electrode 11 of a resistive layer insulator semiconductor field effect transistor 10. The drain electrode 11 of the field effect transistor 10 is connected through the condenser 14 to the second gate electrode 9 while the source electrode 12 thereof is connected to a signal output terminal 31. The substrate 1 thereof is connected to the positive voltage source terminal +B to be applied with a reverse biasing voltage. Further, the source electrode 12 is connected through a series connection of a resistor 32 and a level controlling variable resistor 33 to a negative voltage source terminal −B to which a negative DC voltage, for example, a volage of −20 volts is supplied, and the connection point between the resistor 32 and variable resistor 33 is grounded. In addition, the first gate electrode 8 of the field effect transistor 10 is connected to a variable tap 33a of the variable resistor 33 and also to the negative voltage source terminal −B through a condenser 34.

Figure 7:
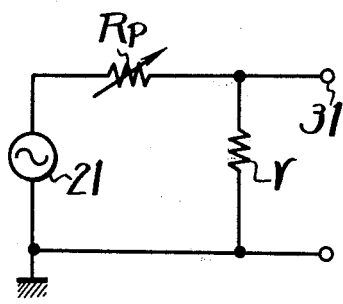
FIG. 7 is an equivalent circuit diagram of the circuit of FIG. 6.

The equivalent circuit for the circuit of FIG. 6 is shown in FIG. 7, in which an equivalent resistance $R_p$ of the resistive layer insulator semiconductor field effect transistor 10 being variable according to the gate voltage $V_{GO}$ and a resistance $r$ of the resistor 32 are connected in series with the input signal source 21 and the signal output terminal 31 is led out from the connection point between the resistances $R_p$ and $r$. In the circuit of FIG. 6, the relationship between an input signal voltage $V_i$ and an output signal voltage $V_o$ is expressed as follows:

$$V_o = V_i \frac{r}{R_p + r} = \frac{V_i \cdot r}{\frac{1}{\beta(V_{GO} - V_{th})} + r} = \frac{V_i}{1 + \frac{1}{r\beta(V_{GO} - V_{th})}} \qquad (5)$$

Accordingly, the voltage gain G of the circuit is obtained by the following equation (6):

$$G = \frac{V_o}{V_i} = \frac{1}{1 + \frac{1}{r\beta(V_{GO} - V_{th})}} \qquad (6)$$

It is noticed from the equation (6) that the gain G is less than 1. The equation (6) is illustrated as in FIG. 8 by a curve $a$, from which it is understood that the gain G is not varied linearly to the variation of the gate control voltage $V_{GO}$ and becomes non-linear. The non-linearity of the gain-gate control voltage characteristic curve will be frequently undesirable for a circuit design.

In view of the above aspect, the present invention is to provide a signal level control circuit such that the gain G can be controlled substantially in a linear manner relative to the gate control voltage $V_{GO}$.

Figure 9:
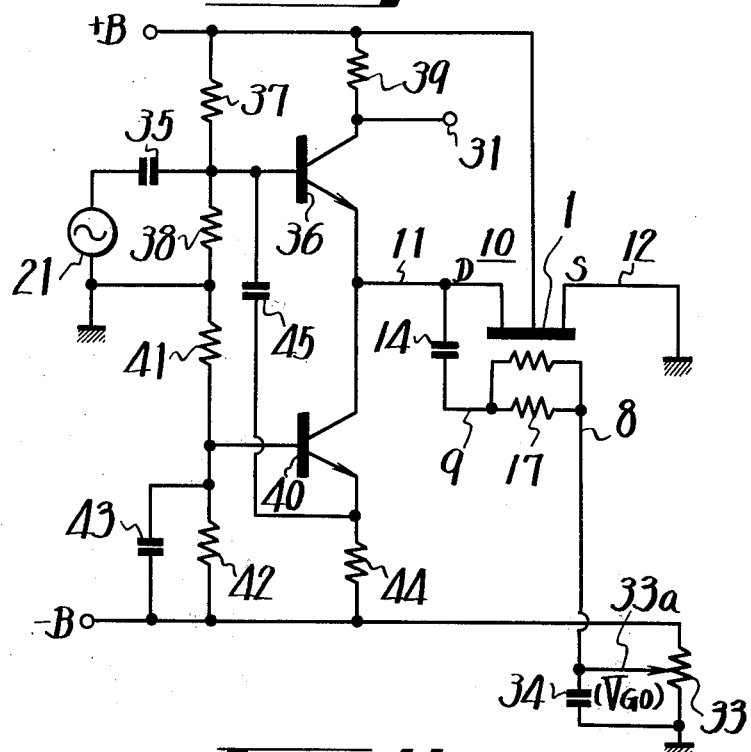
FIG. 9 is a schematic diagram of a signal level control circuit according to the invention.

A description will hereinbelow be given on one embodiment of the signal level control circuit of this invention with reference to FIG. 9. In FIG. 9, elements corresponding to those of FIG. 6 are marked with the same references with their detailed description being omitted.

In this embodiment, one end of the input signal souce 21 is grounded while the other end thereof is connected through a condenser 35 to the base electrode of an npn-type amplifying transistor 36. The base electrode of the transistor 36 is connected through a resistor 37 to the positive voltage source terminal +B and also through a resistor 38 to the ground. The collector electrode of the transistor 36 is connected through a resistor 39 to the positive voltage source terminal +B and also the signal output terminal 31 is led out from the collector electrode of the transistor 36. The emitter electrode of the transistor 36 is connected to the collector electrode of an npn-type transistor 40 forming a constant current source and also to the drain electrode 11 of the resistive layer insulator semiconductor field effect transistor 10. The drain electrode 11 of the field effect transistor 10 is connected through the condenser 14 to the second gate electrode 9 of the field effect transister 10, while the source electrode 12 thereof is grounded. The first gate electrode 8 of the field effect transistor 10 is connected to the variable tap 33a of the level controlling variable resistor 33 and also through the condenser 34 to the ground. Since condenser 34 establishes gate electrode 8 at AC ground, this gate electrode has the same AC potential as the FET source electrode 12. The base electrode of the transistor 40 is grounded through a resistor 41 and also connected through a parallel connection of a resistor 42 and a condenser 43 to the negative voltage source terminal −B. The emitter electrode of the transistor 40 is connected through a resistor 44 to the negative voltage source terminal −B. In addition, the base electrode of the transistor 36 is connected to the emitter electrode of the transistor 40 through a condenser 45 having a capacitance value $C_f$ such as to cancel a capacity $C_{DS}$ between the drain and source electrodes of the field effect transistor 10.

With the above mentioned construction of this invention where the resistive layer insulator semiconductor field effect transistor 10 having the equivalent resistance $R_p$ and the collector electrode of the transistor 40 forming the constant current source are both connected to the emitter electrode of the transistor 36, the input signal $V_i$ is applied to the base electrode of the transistor 36 and the output signal $V_o$ is derived from the collector electrode thereof. In this case, an impedance value looking toward the collector side of the transistor 40 from the transistor 36 is considered to be substantially infinitive, so that the voltage gain $G_a$ due to the transistor 36 is expressed by the following equation with the resistance value of the resistor 39 being taken as $R_c$.

$$G_a = \frac{R_c}{R_p} \qquad (7)$$

If a condition $R_p = 1/\beta (V_{GO} - V\text{th})$ is substituted in the equation (7), the following equation is obtained:

$$G_a = R_c \beta (V_{GO} - V\text{th}) \qquad 8.$$

Figure 8:
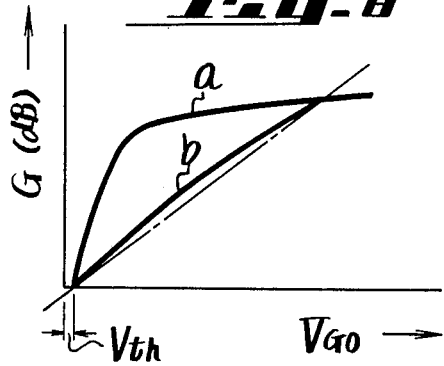
FIG. 8 is a characteristic diagram to be used for explaining the present invention.

It is noticed from the above equation (8) that the gain $G_a$ is proportional to the gate voltage $V_{GO}$ and the proportional factor is $R_c\beta$. Therefore, according to the present invention, the gain $G_a$ is changed linearly with respect to the variation of the gate control voltage $V_{GO}$ as indicated by a curve $b$ in FIG. 8. It is considered that the reason why the curve $b$ is not completely linear is because of the variation of $\beta$. In FIG. 8, a dash-chain line shows an ideal gain-gate control voltage characteristic curve. Further, since the transistor 36 operates as an emitter-grounded amplifier, an arbitrary gain more than 1 can be easily obtained by selecting the value of the resistor 39. In this case, it is experimentally ascertained that, if a resistor is inserted between the negative voltage source terminal −B and the variable tap of the variable resistor 33, the linearity of the gain-gate control voltage characteristic can be further improved.

Figure 10:
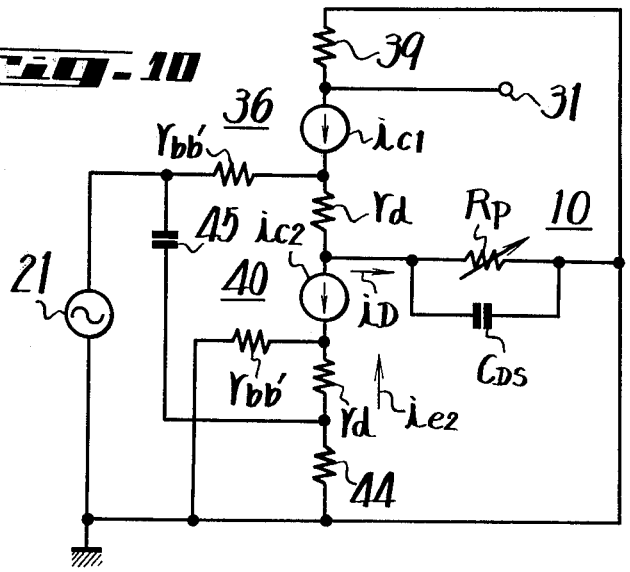
FIG. 10 is an equivalent circuit diagram of the circuit of FIG. 9 for a high frequency signal.

The capacity $C_{DS}$ between drain and source electrodes of the resistive layer insulator semiconductor field effect transistor 10 is about 6 pF (picofarod). However, according to this embodiment, since the condenser 45 is inserted between the base electrode of the transistor 36 and the emitter electrode of the transistor 40, the level increase in high frequency range due to the drain-source capacity $C_{DS}$ and the signal leakage in high frequency range at signal cut-off time can be completely compensated for such as to be nearly zero, which will be herinbelow described in detail. FIG. 10 shows an equivalent circuit of the circuit of FIG. 9 for a high frequency signal. In FIG. 10, reference $r_{bb}'$ indicates a base spreading resistance of the transistor 36 or 40 and $r_d$ an emitter spreading resistance thereof. In this equivalent circuit, if the respective resistors $r_{bb}'$ and $r_d$ of the transistors 36 and 40 are neglected, a signal current $i_D$ flowing through the resistive layer insulator semiconductor field effect transistor 10 is expressed as follows:

$$i_D = \frac{V_i}{Z_p} = V_i \left( \frac{1}{R_p} + j\omega C_{DS} \right) \qquad (9)$$

where $Z_p$ is an impedance of the field effect transistor 10. Meanwhile, a current $i_{c2}$ flowing through the condenser 45 into the transistor 40 is expressed by the following equation:

$$i_{c2} = \frac{V_i}{\frac{1}{j\omega Cf}} = V_i \cdot j\omega Cf \qquad (10)$$

where $Cf$ is the capacitance of the condenser 45.

Further, since a collector current $i_{c2}$ of the transistor 40 is substantially the same as the reverse-polarized value of the current $i_{c2}$, the following equation is obtained:

$$i_{c2} \approx i_{c2} = -V_i j\omega Cf \qquad 11.$$

A collector current $i_{c1}$ of the transistor 36 is substantially the same as the composite current of the signal current $i_D$ flowing through the field effect transistor 10 and the collector current $i_{c2}$ of the transistor 40, so that the following equation is obtained from the equations (9) and (11):

$$i_{c1} \approx i_D + i_{c2} = V_i \left\{ \frac{1}{R_p} + j\omega (C_{DS} - Cf) \right\} \qquad (12)$$

If the capacitance value $Cf$ of the condenser 45 is selected equal to the source-drain capacity $C_{DS}$ of the resistive layer insulator semiconductor field effect transistor 10, the following equation is derived from the equation (12):

$$i_{c1} \approx \frac{V_i}{R_p} \qquad (13)$$

Accordingly, the following equation is established:

$$V_o = R_c i_{c1} = V_i \frac{R_c}{R_p} \qquad (14)$$

In other words, the equation (14) reveals that the gain of the circuit of FIG. 9 is substantially constant independent of the signal frequency.

Meantime, with the above described circuit of FIG. 9, the drain electrode of the resistive layer insulator semiconductor field effect transistor 10 is connected to the emitter electrode of the transistor 36 and the source electrode thereof is directly grounded, that is, both the drain and source electrodes are respectively connected to the low impedance circuits, so that the cross talk induced in the collector or output electrode of the transistor 36 through the field effect transistor 10 is extremely small.

Generally, in the resistive layer insulator semiconductor field effect transistor 10, when a DC current flow between the drain and source electrodes, its characteristic is thereby deteriorated and the distortion of the circuit is extremely increased. Therefore, the field effect transistor 10 is normally used with the large-capacitive condenser 28 being AC-coupled as seen in the circuit shown in FIG. 6. However, with the circuit of FIG. 9 according to this invention, the emitter electrode of the transistor 36 can be made zero in DC potential by suitably selecting the resistance values of the biasing resistors 37 and 38. As a result, even though the drain electrode of the field effect transistor 10 is directly connected to the emitter electrode of the transistor 36 with no condenser being used, no DC current flows through the field effect transistor 10.

As described above, the circuit of FIG. 9 is the signal level control circuit having a number of advantages as compared with the prior art circuits, but the response speed to the control voltage $V_{GO}$ can not be made sufficiently fast under the influence of the condenser 14 and the resistor 17. In other words, for the variation of the control voltage $V_{GO}$, the potential at the first gate electrode 8 of the field effect transistor 10 is followed without being delayed, while the potential at the second gate electrode 9 thereof is changed with a time constant of $\tau g = C_{14} R_{17}$. The drain-source impedance of the field effect transistor 10 is gradually changed during the period of this time constant and its variation is stabilized to stop at a time when the second gate potential becomes $V_D + V_{GO}$. Accordingly, it is to be noticed that the response speed to the variation of the drain-source impedance of the field effect transistor 10 is determined by the time constant $\tau_g$, so that the smaller the time constant $\tau_g$ is, the faster becomes the response speed.

Thus, it is considered that the values of $C_{14}$ and/or $R_{17}$ are made small to decrease the time constant $\tau_g$ with the result that the response speed is made fast. However, if the value of $\tau_g$ is decreased to some extent, the equations (4-2) and/or (4-3) will not be satisfied and hence the characteristic of the signal level control circuit is deteriorated to produce the distortion in the output signal. In the case when the input signal is a video signal, by way of example, it is necessary to make the time constant $\tau_g$ more than 2 seconds from a viewpoint of distortion in the output signal, while it is desired to make the time constant $\tau_g$ less than 0.1 second from a viewpoint of the response speed.

Figure 11:
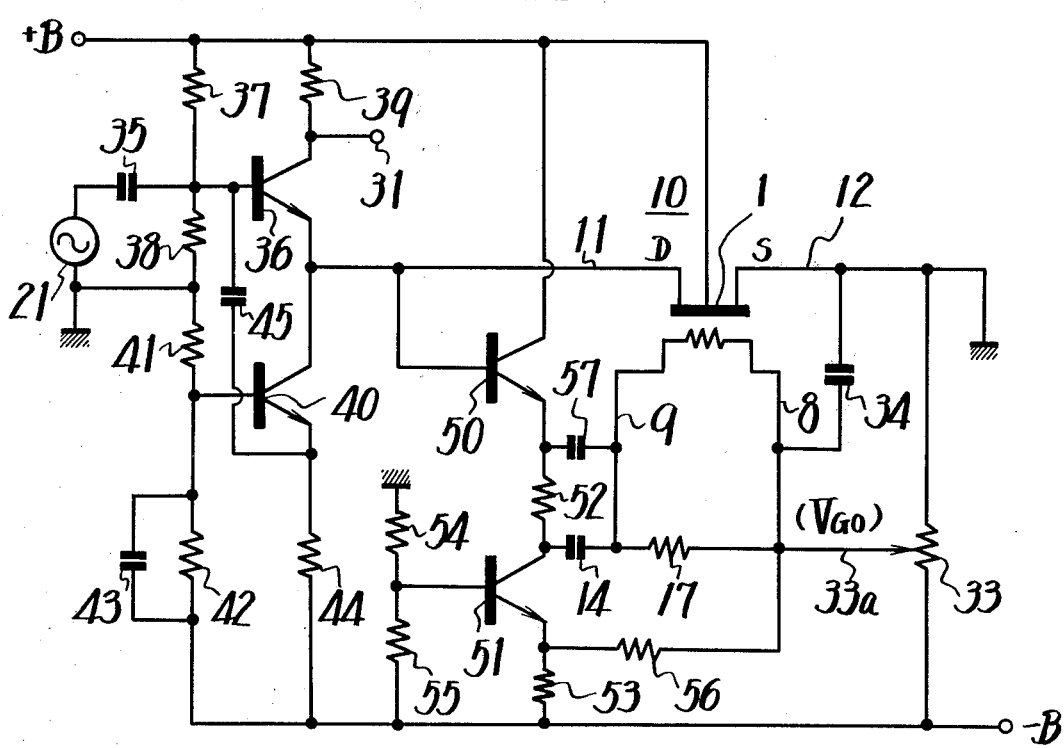
FIG. 11 is a schematic diagram of another embodiment of the invention.
Figure 12:
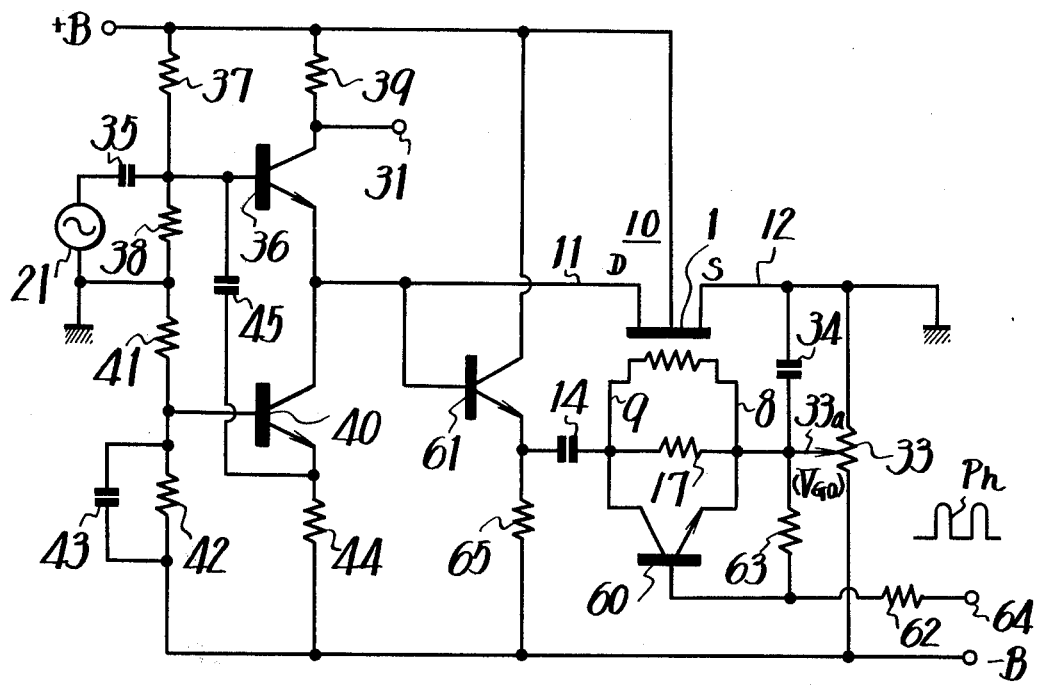
FIG. 12 is a schematic diagram of a further embodiment of the invention.

In view of the above aspect, more improved signal level control circuits according to the invention is proposed as shown in FIGS. 11 and 12 in which the response speed is made fast with the distortion characteristic being not deteriorated.

Firstly, the signal level control circuit shown in FIG. 11 is hereinafter described in which like reference numerals or characters have been applied to elements corresponding to those of the circuit of FIG. 9 and detailed explanation thereof will be omitted for the sake of brevity.

In FIG. 11, there is provided a buffer transistor 50. The base electrode of the transistor 50 is connected to the drain electrode of the field effect transistor 10, the collector electrode thereof is connected to the positive voltage source terminal +B and the emitter electrode thereof is connected through a resistor 52 to the collector electrode of a transistor 51. The emitter electrode of the transistor 51 is connected through a resistor 53 to the negative voltage source terminal −B and the base electrode thereof is applied with a predetermined biasing voltage by a voltage divider consisting of resistors 54 and 55. The emitter electrode of the transistor 51 is also connected through a resistor 56 to the first gate electrode 8 of the field effect transistor 10 and the collector electrode thereof is connected through the condenser 14 to the second gate electrode 9 of the field effect transistor 10. The emitter electrode of the transistor 50 is also connected through a condenser 57 to the second gate electrode 9 of the field effect transistor 10. The condenser 57 is served to compensate for the deterioration of the frequency characteristic of the circuit caused by the resistor 52 and a collector-base stray capacity of the transistor 51. In this case, if the resistance values of the resistors 53 and 56 are taken as $R_{53}$ and $R_{56}$, respectively, they are selected to satisfy a condition of $R_{53} >> R_{56}$. The values of the condenser 14 and the resistor 17 are selected so as to satisfy the equations (4-1) to (4-3).

In the operation of the circuit of FIG. 11, the transistor 51 operates as a constant current source and the transistor 50 operates as an emitter follower type, so that an alternating potential variation yielded in the base electrode of the transistor 50 appears, as it is, at the collector electrode of the transistor 51. Accordingly, the condenser 14 becomes equivalent to that connected directly between the drain and second gate electrode of the field effect transistor 10 in an AC manner. The control voltage $V_{GO}$ is supplied directly to the first gate electrode 8 of the field effect transistor 10 but through the resistor 17 to the second gate electrode 9 thereof. In this case, however, the control voltage $V_{GO}$ also appears at the collector electrode of the transistor 51 through the resistor 56 and its emitter-collector path, so that the condenser 14 is applied with the control voltage $V_{GO}$ both at its terminals and hence charging and discharging currents do not flow through the condenser. As a result, in spite of the time constant of the condenser 14 and the resistor 17, the drain-source impedance of the field effect transistor 10 responds instantaneously to the variation of the control voltage $V_{GO}$.

The operation of the circuit of FIG. 11 will be hereinbelow described more in detail and theoretically as follows.

At first, the negative potential −B is considered as the reference voltage for all the circuit points for the sake of brevity. Further, if the base voltage of the transistor 51 is taken as $V_B$ and currents flowing through the resistors 53 and 56 as $I_{53}$ and $I_{56}$, the emitter current $I_E$ of the transistor 51 is expressed as follows:

$$I_E = I_{53} + I_{56}$$
$$= \frac{V_B}{R_{53}} + \frac{V_B - V_{GO}}{R_{56}}$$
$$= \frac{V_B}{\frac{R_{53}(R_{56})}{R_{53} + R_{56}}} - \frac{V_{GO}}{R_{56}} \quad (15)$$

where the voltage drop between the base and emitter electrodes of the transistor 51 is neglected. Since the current flowing through the resistor 52 is substantially the same as the emitter current $I_E$ of the transistor 51, if the resistance value of the resistor 52 is taken as $R_{52}$, the collector potential $V_C$ of the transistor 51 is expresed as follows:

$$V_C \approx B - R_{52}I_E \quad 16.$$

If the equation (15) is substituted for the equation (16), the following equation is obtained:

$$V_C \approx (B - \frac{V_B R_{52}}{\frac{R_{53}(R_{56})}{R_{53}+ R_{56}}}) + \frac{R_{52}}{R_{56}} V_{GO} \quad (17)$$

In the equation (17), the first term of its right side expresses the voltage drop due to biasing current, which is constant, and the second term expresses the voltage variation due to the control voltage $V_{GO}$. Accordingly, if a condition $R_{52} = R_{56}$ is satisfied, the equation (17) will become as follows:

$$V_C = V_K + V_{GO} \quad 18.$$

where $$V_K = B - \frac{V_B R_{52}}{\frac{R_{53}(R_{56})}{R_{53} + R_{56}}} : \text{constant}$$

It will be understood from the equation (18) that the collector potential $V_C$ of the transistor 51 is changed following to the control voltage $V_{GO}$ to the same direction as the latter's and the voltage across the condenser 14 is held constant when the control voltage $V_{GO}$ is varied. Accordingly, it is noticed that, in spite of the time constant due to the condenser 14 and the resistor 17, the drain-source impedance of the field effect transistor 10 can be rapidly changed for the variation of the control voltage $V_{GO}$ and hence its response speed is improved as compared with the circuit of FIG. 9.

FIG. 12 shows another signal level control circuit in which response speed of the circuit is improved. In FIG. 12, like reference numerals or characters have been applied to elements corresponding to those of the circuit of FIG. 9 and detailed explanation thereof will be omitted for the sake of brevity.

In FIG. 12 there is provided a switching transistor 60. The collector-emitter path of the transistor 60 is connected in parallel between the first and second gate electrodes 8 and 9 of the field effect transistor 10, and the base electrode of the transistor 60 is connected through a resistor 62 to an external terminal 64 and also through a resistor 63 to the variable tap 33a of the variable resistor 33. Further, there is provided an emitter follower transistor 61 the base electrode of which is connected to the drain electrode of the field effect transistor 10. The emitter electrode of the transistor 61 is connected through a resistor 65 to the negative voltage source terminal —B and also through the condenser 14 to the second gate electrode 9 of the field effect transistor 10. Further, the collector electrode of the transistor 61 is connected to the positive voltage source terminal +B.

In the above described circuit of FIG. 12, the values of the condenser 14 and the resistor 17 are selected to satisfy the equations (4-1) to (4-3) and a switching signal $P_h$ is applied to the external terminal 64. In the case that the input signal source 21 is a source for video signals, a horizontal pulse train is used as the switching signal $P_h$.

Figure 13:
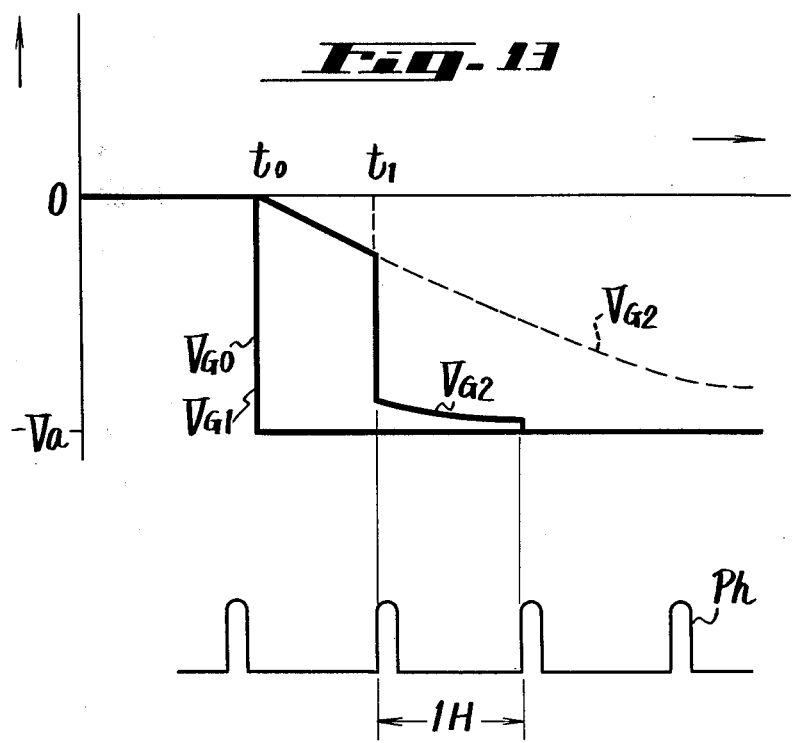
FIG. 13 is a characteristic diagram to be used for explaining the operation of the circuit of FIG. 12.

In the operation of the circuit of FIG. 12, since the transistor 61 is of the emitter follower configuration, if the transistor 60 is made non-conductive, the circuit of FIG. 12 operates substantially similar to that of FIG. 9. Accordingly, if the control voltage $V_{GO}$ is lowered from zero to $-V_a$ at a time $t_o$ as shown in FIG. 13 in order to raise the gain of the signal level control circuit when the transistor 60 is non-conductive, the potential $V_{G1}$ of the first gate electrode 8 of the field effect transistor 10 is insantaneously lowered to $-V_a$. While, the potential $V_{G2}$ of the second gate electrode 9 is gradually lowered as indicated by a dotted line in FIG. 13 because the time constant due to the condenser 14 and the resistor 17 is large.

However, since the base electrode of the transistor 60 is applied with the switching signal $P_h$, when the switching signal is of the horizontal pulse train, the transistor 60 will be made conductive at every horizontal blanking time period.

Thus, when the transistor 60 is made conductive by a horizontal pulse at a time $t_1$, the condenser 14 is abruptly charged through the transistor 60 and the potential $V_{G2}$ of the second gate electrode 9 of the field effect transistor 10 is rapidly lowered and then reached to the voltage of $-V_a$ after one to two horizontal periods or about 100 micro seconds as shown in FIG. 13 by a solid line.

In other words, the time constant during a time period when the transistor 60 is made conductive is determined as a product of the capacitance of the condenser 14 and the collector-emitter impedance of the transistor 60 the value of which is several hundred ohms. On the other hand, since the resistance $R_{17}$ of the resistor 17 is several mega-ohms as previously mentioned, the time constant is made extremely shorter such as being about 1/10000 of the former.

During the horizontal scanning period, the transistor 60 is made non-conductive, so that the time constant at this time becomes $C_{14} \cdot R_{17}$. That is, the time constant becomes large and the equations (4-1) to (4-3) are satisfied, so that no distortion is produced in the video signal obtained at the signal output terminal 31. In other words, the circuit of FIG. 12 is advantageous in that it is faster in response speed than that of FIG. 9.

In the explanation above, the circuit of FIG. 12 is supplied with video signals from the input signal source 21. However, it is to be understood that any signal source such as PCM signal source which supplies intermittent input signals is available and in this case switching signals are formed between the intermittent input signals and used as the signal $P_h$.

While the invention has been particularly shown and described with reference to specific embodiments thereof, it will be obvious to those skilled in the art that the foregoing and various other changes and modifications in form and details may be made without departing from the spirit and scope of the invention. It is therefore intended that the appended claims be interpreted as including all such changes and modifications.

We claim as our invention:

1. A signal level control circuit adapted for providing a linear gain control, comprising:
   a. an amplifying transistor having base, emitter and collector electrodes;
   b. a resistive layer insulator semiconductor field effect transistor having source, drain, first gate and second gate electrodes in which a resistive layer is formed between the first and second gate electrodes, said field effect transistor having a drain-source impedance characteristic which is an inverse function of a control voltage applied across the first and second gates, said field effect transistor further comprising,
      1. a semiconductor substrate of one impurity type,
      2. two spaced regions of opposite conductivity type in respect to said substrate in one face thereof providing source and drain regions respectively,
      3. a layer of insulating material overlying said one face, and
      4. a layer of resistive material overlying said insulating layer, said source and drain electrodes making ohmic contact with said source and drain regions respectively, and said first and second gate electrodes making ohmic contact with the portions of said resistive layer which overlies said source and drain regions respectively;
   c. circuit means for connecting the drain and source path in series with the base and emitter path of said amplifying transistor;
   d. signal input means connected to the base electrode of said amplifying transistor;
   e. control means for applying a control voltage to the first and second gate electrodes of said field effect transistor for controlling the equivalent impedance between the drain and source electrodes of said field effect transistor;
   f. signal output means connected to the collector electrode of said amplifying transistor
   g. circuit means for making A.C. potential at the first gate electrode of said field effect transistor substantially the same as the A.C. potential at the source electrode thereof; and
   h. circuit means including a condenser for connecting the second gate electrode of said field effect transistor to the drain electrode thereof.

2. A signal level control circuit according to claim 1 which further comprises: constant current source means connected between said control means and circuit means including a condenser for connecting the second gate electrode of said field effect transistor to the drain electrode thereof for varying the voltage at the drain side of said condenser in the same direction as the voltage at said second gate side of said condenser when said control voltage varies.

3. A signal level control circuit according to claim 1 wherein said signal input means supplies intermittent signals; and said level control circuit further comprises:
   1. a switching element connected between the first and second gate electrodes of said field effect transistor, and
   2. a switching signal source connected to said switching element for making the switching element conductive between the input signals and making the same non-conductive during the input signal portion.

4. A signal level control circuit according to claim 1 which further comprises:
   1. a constant current circuit connected in parallel with the drain and source path of said field effect transistor, and
   2. biasing means connected to said constant current circuit for making the D.C. voltage at the drain electrode of said field effect transistor substantially same as the D.C. voltage at the source electrode thereof.

5. A signal level control circuit according to claim 4 wherein said constant current circuit includes a transistor having base, emitter and collector electrodes; the collector and emitter path thereof being connected in parallel with the drain and source path of said field effect transistor; and the base electrode thereof being connected to said biasing means.

6. A signal level control circuit according to claim 5 which further comprises: a condenser connected between the base electrode of said amplifying transistor and the emitter electrode of said transistor included in said constant current circuit.

7. A signal level control circuit comprising:
   A. an input signal source;
   B. a resistive layer insulator semiconductor field effect transitor comprising:
      1. a semiconductor substrate of one impurity type,
      2. two spaced regions of opposite conductivity type in respect to said substrate in one face thereof providing source and drain regions respectively,
      3. a layer of insulating material overlying said one face,
      4. a layer of resistive material overlying said insulating layer,
      5. source and drain electrodes making ohmic contact with said source and drain regions respectively, and
      6. first and second gate electrodes making ohmic contact with the portions of said resistive layer which overlies said source and drain regions respectively;
   C. circuit means for making the A.C. potential at the first gate electrode of said field effect transistor substantially same as the A.C. potential at the source electrode thereof;
   D. circuit means including a condenser for connecting the second gate electrode of said field effect transistor to the drain electrode thereof;
   E. circuit means for connecting the drain and source path of said field effect transistor in series with said input signal source;
   F. signal output means connected to said circuit means for connecting the drain-source path of said field effect transistor in series with said input signal source;
   G. control means for applying a control voltage to the first and second gate electrodes of said field effect transistor to control the equivalent impedance between the drain and source electrodes and thereby to control the signal level obtained from said signal output means; and
   H. constant current source means connected between said control means and said circuit means including a condenser for connecting the second gate of said field effect transistor to the drain electrode thereof for varying the voltage at the drain side of said condenser in the same direction as the voltage at said second gate side of said condenser when said control voltage varies.

8. A signal level control circuit comprising:
A. an input signal source for supplying intermittent signals;
B. a resistive layer insulator semiconductor field effect transistor comprising:
   1. a semiconductor substrate of one impurity type,
   2. two spaced regions of opposite conductivity type in respect to said substrate in one face thereof providing source and drain regions respectively,
   3. a layer of insulating material overlying said one face,
   4. a layer of resistive material overlying said insulating layer,
   5. source and drain electrodes making ohmic contact with said source and drain regions respectively, and
   6. first and second gate electrodes making ohmic contact with the portions of said resistive layer which overlies said source and drain regions respectively;
C. circuit means for making the A.C. potential at the first gate electrode of said field effect transistor substantially same as the A.C. potential at the source electrode thereof;
D. circuit means including a condenser for connecting the second gate electrode of said field effect transistor to the drain electrode thereof;
E. circuit means for connecting the drain and source path of said field effect transistor in series with said input signal source;
F. signal output means connected to said field effect transistor;
G. control means for applying a control voltage to the first and second gate electrodes of said field effect transistor to control the equivalent impedance between the drain and source electrodes and thereby to control the signal level obtained from said signal output means;
H. a switching element connected between the first and second gate electrodes of said field effect transistor, and
I. a switching signal source connected to said switching element for making the switching element conductive between the input signals and making the same non-conductive during the input signal portions.

* * * * *